US012665796B2

(12) United States Patent
Kwon et al.

(10) Patent No.: US 12,665,796 B2
(45) Date of Patent: Jun. 23, 2026

(54) HIGH-SPEED COMMUNICATION METHOD AND DEVICE BASED ON DUOBINARY SIGNAL

(71) Applicant: Korea Advanced Institute of Science and Technology, Daejeon (KR)

(72) Inventors: Kyeongha Kwon, Daejeon (KR); Jung Hoo Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 8 days.

(21) Appl. No.: 18/904,957

(22) Filed: Oct. 2, 2024

(65) Prior Publication Data

US 2025/0358158 A1     Nov. 20, 2025

(30) Foreign Application Priority Data

May 14, 2024     (KR) ........................ 10-2024-0063454

(51) Int. Cl.
H04L 27/01        (2006.01)
H03K 17/687        (2006.01)
(Continued)

(52) U.S. Cl.
CPC ......... H04L 27/01 (2013.01); H03K 17/6872 (2013.01); H04L 25/4917 (2013.01); H03K 19/20 (2013.01)

(58) Field of Classification Search
CPC . H04L 27/01; H04L 25/4917; H03K 17/6872; H03K 19/20
(Continued)

(56) References Cited

U.S. PATENT DOCUMENTS 5,424,991 A * 6/1995 Hu ...................... G11C 16/3409
                                                365/185.12
2008/0075160 A1* 3/2008 Yamaguchi .............. H04B 3/06
                                                375/233
(Continued)

FOREIGN PATENT DOCUMENTS

KR     10-2020-0001198 A     1/2020
KR     10-2021-0115980 A     9/2021
(Continued)

OTHER PUBLICATIONS

Wang et al., "A Low BER DB-PAM4 Adaptive Equalizer for Large Channel Loss in Wireline Receivers," Circuit and Signal Proc., Electronics, Sep. 13, 2022, 11, 2906, pp. 1-13.
(Continued)

*Primary Examiner* — Kevin M Burd
(74) *Attorney, Agent, or Firm* — Knobbe, Martens, Olson & Bear, LLP

(57) ABSTRACT

Proposed is a high-speed communication device based on a duobinary signal. The device may include an output circuit configured to output a duobinary signal. The device may also include a first compensation circuit configured to apply a first equalization (EQ) for amplifying the duobinary signal to a voltage to be transitioned during voltage transition of the duobinary signal. The device may further include a second compensation circuit configured to apply a second EQ for saturating the duobinary signal to a predetermined voltage after the first EQ is applied.

18 Claims, 10 Drawing Sheets

(51) Int. Cl.
    *H04L 25/49*         (2006.01)
    *H03K 19/20*        (2006.01)

(58) Field of Classification Search
    USPC ......................................................... 375/231
    See application file for complete search history.

(56)                    References Cited

U.S. PATENT DOCUMENTS

| | | | |
|---|---|---|---|
| 2014/0255037 A1 | 9/2014 | Shang | |
| 2015/0222236 A1* | 8/2015 | Takemoto | H03F 3/08 |
| | | | 250/214 A |
| 2020/0092075 A1 | 3/2020 | Ahn | |
| 2022/0075725 A1* | 3/2022 | Jin | G06F 12/0802 |

FOREIGN PATENT DOCUMENTS

| | | |
|---|---|---|
| KR | 10-2022-0026773 A | 3/2022 |
| KR | 10-2022-0034561 A | 3/2022 |
| KR | 10-2022-0044297 A | 4/2022 |

OTHER PUBLICATIONS

Office Action received in Korean Application No. 10-2024-0063454 dated Aug. 4, 2025.

\* cited by examiner

100

| 110 | 120 | 130 | 140 | 150 |
|---|---|---|---|---|
| OUTPUT CIRCUIT | FIRST COMPENSATION CIRCUIT | SECOND COMPENSATION CIRCUIT | TRANSIMPEDANCE AMPLIFIER | VOLTAGE SOURCE |

200

| 210 | 220 | 240 |
|---|---|---|
| INPUT UNIT | OUTPUT UNIT | MEMORY |
| 230 | 260 | 250 |
| PROCESSOR | COMMUNICATION UNIT | DUOBINARY SIGNAL -BASED HIGH-SPEED COMMUNICATION PROGRAM |

HIGH-SPEED COMMUNICATION METHOD AND DEVICE BASED ON DUOBINARY SIGNAL

CROSS-REFERENCE TO RELATED APPLICATION

This application claims priority to Korean Patent Application No. 10-2024-0063454, filed on May 14, 2024, the entirety of which is incorporated herein by reference for all purposes.

STATEMENT REGARDING GOVERNMENT SPONSORED RESEARCH OR DEVELOPMENT

This work was supported by Institute of Information & communications Technology Planning & Evaluation (IITP) grant funded by the Korea government (Ministry of Science and ICT) (Project No.: 2022-0-00991; R&D project: PIM Artificial Intelligence Semiconductor Core Technology Development; Research Project Title: Development of intelligent PHY interface technology for PIM high-speed data transmission and reception; and Project period: 2023.01.01.~2023.12.31.), and Korea University Research and Business Development Foundation grant funded by the Korea government (Ministry of Science and ICT) (Project No.: 2022-0-01171; R&D project: PIM Artificial Intelligence Semiconductor Core Technology Development; Research Project Title: Ultra-high-efficiency, high-bandwidth Processing-in-Memory operation accelerator based on DRAM 1T-1C array structure; and Project period: 2023.01.01.~ 2023.12.31.). This work was supported by the Institute of Information & Communications Technology Planning & Evaluation (IITP) grant funded by the Korea government (Ministry of Science and ICT) under the research project entitled 'Graduate School of Artificial Intelligence Semiconductor' (No. 2710093986).

TECHNICAL FIELD

The present disclosure relates to a high-speed communication method and device based on a duobinary signal.

BACKGROUND

NRZ (non-return-to-zero) is a method of encoding binary digital data for data transmission. An NRZ signal has transitions from one state to a positive voltage and from the other state to a negative voltage, and it does not return to zero. NRZ is PAM2 (pulse-amplitude modulation 2-levels) signaling method, which represents signals with two levels of voltage.

Unlike NRZ, duobinary signaling and di-code signaling are PAM3 (pulse-amplitude modulation 3-level) signaling method, which represent signals with three levels of voltage: high level (1), middle level (0.5), and low level (0). A signaling method can be determined as either duobinary signaling or di-code signaling, depending on encoding method.

SUMMARY

One aspect is a high-speed communication method and device based on a duobinary signal.

Another aspect is a high-speed communication device based on a duobinary signal comprising, an output circuit configured to output a duobinary signal, a first compensation circuit configured to apply a first equalization (EQ) for amplifying the duobinary signal to a voltage to be transitioned during voltage transition of the duobinary signal; and a second compensation circuit configured to apply a second EQ for saturating the duobinary signal to a predetermined voltage after the first EQ is applied.

The duobinary signal may include a signal representing data with a high level voltage, a low level voltage, and a middle level voltage.

The high-speed communication device may further comprise a transimpedance amplifier (TIA) configured to amplify the output duobinary signal.

The first EQ may be applied for one unit interval (UI), the second EQ is applied for one or more UIs.

The high-speed communication device may further comprise a high level voltage source configured to supply a high level voltage to the output circuit, the first compensation circuit, and the second compensation circuit, a low level voltage source configured to supply a low level voltage to the output circuit, the first compensation circuit, and the second compensation circuit and a middle level voltage source configured to supply supplying a middle level voltage to the output circuit, the first compensation circuit, and the second compensation circuit. Here, the output circuit may include a first P-channel metal oxide semiconductor (PMOS) configured to supply the high level voltage, a first N-channel metal oxide semiconductor (NMOS) configured to supply the low level voltage and a second PMOS and a second NMOS configured to supply the middle level voltage.

The first PMOS contains a gate to which a first duobinary driving signal is applied and one node to which the high level voltage source is connected such that the high level voltage is supplied to an output node of the output circuit, The first NMOS may contain a gate to which a second duobinary driving signal is applied and one node to which the low level voltage source is connected such that the low level voltage is supplied to the output node, the second NMOS may contain a gate to which a third duobinary driving signal is applied and one node to which the middle level voltage is applied such that the middle level voltage is supplied to the output node, and the second PMOS may contain a gate to which an inversion signal of the third duobinary driving signal is applied and one node to which the middle level voltage is applied such that the middle level voltage is supplied to the output node.

The first duobinary driving signal may include a signal output through a NAND operation circuit configured to receive an output signal during n UI (n being a natural number) and an output signal during n−1 UI and output a NAND operation result, and a NOT operation circuit configured to receive the output NAND operation result and output a result of 2m NOT operations (m being a natural number).

The second duobinary driving signal may include a signal output through a NAND operation circuit configured to receive an inversion signal of an output signal during n UI (n being a natural number) and an inversion signal of an output signal during n−1 UI and output a NAND operation result, and a NOT operation circuit configured to receive the output NAND operation result and output a result of 2m−1 NOT operations (m being a natural number).

The third duobinary driving signal may include a signal output through a third NOR operation circuit configured to receive a first NOR operation result obtained by inputting an output signal during n UI (n being a natural number) and an output signal during n−1 UI to a first NOR operation circuit and a second NOR operation result obtained by inputting an inversion signal of an output signal during n UI and an inversion signal of an output signal during n−1 UI to a second NOR operation circuit and output a third NOR operation result, and a NOT operation circuit configured to receive the output third NOR operation result and output a result of 2m NOT operations (m being a natural number).

The inversion signal of the third duobinary driving signal may include a signal output through a third NAND operation circuit configured to receive a first NAND operation result obtained by inputting an output signal during n UI (n being a natural number) and an output signal during n−1 UI to a first NAND operation circuit and a second NAND operation result obtained by inputting an inversion signal of an output signal during n UI and an inversion signal of an output signal during n−1 UI to a second NAND operation circuit and output a third NAND operation result, and a NOT operation circuit configured to receive the output third NAND operation result and output a result of 2m NOT operations (m being a natural number).

The first compensation circuit may include a (1-1)-th compensation circuit configured to apply a (1-1)-th EQ for amplifying the duobinary signal to a voltage to be transitioned during transition of the duobinary signal to the high level voltage or the low level voltage, and a (1-3)-th compensation circuit configured to apply a (1-3)-th EQ for amplifying the duobinary signal to a voltage to be transitioned during transition of the duobinary signal to the middle level voltage.

The (1-1)-th compensation circuit may contain a (1-1)-th PMOS configured to supply the high level voltage and a (1-1)-th NMOS configured to supply the low level voltage, wherein the (1-1)-th PMOS may contain a gate to which a (1-1)-th EQ driving signal is applied and one node to which the high level voltage source is connected such that the high level voltage is supplied to the output node of the output circuit, and the (1-1)-th NMOS may contain a gate to which a (1-2)-th EQ driving signal is applied and one node to which the low level voltage source is connected such that the low level voltage is supplied to the output node.

The (1-1)-th EQ driving signal may include a signal output through a NAND operation circuit configured to receive a first NOR operation result obtained by inputting an output signal during n−2 UI (n being a natural number of 2 or more) and an inversion signal of an output signal during n−1 UI to a first NOR operation circuit and a second NOR operation result obtained by inputting an inversion signal of an output signal during n UI and an inversion signal of an operation signal for the (1-1)-EQ (the (1-1)-th EQ being activated when the operation signal is 1 and being deactivated when the operation signal is 0) to a second NAND operation circuit and output a NAND operation result, and a NOT operation circuit configured to receive the output NAND operation result and output a result of 2m NOT operations (m being a natural number).

The (1-2)-th EQ driving signal may include a signal output through a NOR operation circuit configured to receive a first NAND operation result obtained by inputting an output signal during n−2 UI (n being a natural number of 2 or more) and an inversion signal of an output signal during n−1 UI to a first NAND operation circuit and a second NAND operation result obtained by inputting an inversion signal of an output signal during n UI and an operation signal for the (1-1)-EQ (the (1-1)-th EQ being activated when the operation signal is 1 and being deactivated when the operation signal is 0) to a second NAND operation circuit and output a NOR operation result, and a NOT operation circuit and output a NOR operation result, and a NOT operation circuit configured to receive the output NOR operation result and output a result of 2m NOT operations (m being a natural number).

The (1-3)-th compensation circuit may include a (1-3)-th PMOS configured to supply the high level voltage and a (1-3)-th NMOS configured to supply the low level voltage, wherein the (1-3)-th PMOS may contain a gate to which a (1-3)-th EQ driving signal is applied and one node to which the high level voltage source is connected such that the high level voltage is supplied to the output node of the output circuit, and the (1-3)-th NMOS may contain a gate to which a (1-4)-th EQ driving signal is applied and one node to which the low level voltage source is connected such that the low level voltage is supplied to the output node.

The (1-3)-th EQ driving signal may include a signal output through a NAND operation circuit configured to receive a first NOR operation result obtained by inputting an output signal during n−2 UI (n being a natural number of 2 or more) and an output signal during n−1 UI to a first NOR operation circuit and a second NOR operation result obtained by inputting an inversion signal of an output signal during n UI and an inversion signal of an operation signal for the (1-3)-EQ (the (1-3)-th EQ being activated when the operation signal is 1 and being deactivated when the operation signal is 0) to a second NOR operation circuit and output a NAND operation result, and a NOT operation circuit configured to receive the output NAND operation result and output a result of 2m NOT operations (m being a natural number).

The (1-4)-th EQ driving signal may include a signal output through a NOR operation circuit configured to receive a first NAND operation result obtained by inputting an output signal during n−2 UI (n being a natural number of 2 or more) and an output signal during n−1 UI to a first NAND operation circuit and a second NAND operation result obtained by inputting an inversion signal of an output signal during n UI and an operation signal for the (1-3)-EQ (the (1-3)-th EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

The second compensation circuit may include a third PMOS configured to supply the high level voltage and a third NMOS configured to supply the low level voltage, wherein the third PMOS may contain a gate to which a (2-1)-th EQ driving signal is applied and one node to which the high level voltage source is connected such that the high level voltage is supplied to the output node of the output circuit, and the third NMOS may contain a gate to which a (2-2)-th EQ driving signal is applied and one node to which the low level voltage source is connected such that the low level voltage is supplied to the output node.

The (2-1)-th EQ driving signal may include a signal output through a NAND operation circuit configured to receive a first NOR operation result obtained by inputting an output signal during n−1 UI (n being a natural number of 2 or more) and an output signal during n UI to a first NOR operation circuit and a second NOR operation result obtained by inputting an output signal during n−2 UI and an inversion signal of an operation signal for the second EQ (the second EQ being activated when the operation signal is 1 and being deactivated when the operation signal is 0) to a second NOR operation circuit and output a NAND operation result, and a NOT operation circuit configured to receive the output NAND operation result and output a result of 2m NOT operations (m being a natural number), and wherein the (2-2)-th EQ driving signal may include a signal output through a NOR operation circuit configured to receive a first NAND operation result obtained by inputting an output signal during n−1 UI (n being a natural number of 2 or more) and an output signal during n UI to a first NAND operation circuit and a second NAND operation result obtained by inputting an output signal during n−2 UI and the inversion signal of the operation signal for the second EQ (the second EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

According to the present disclosure, it is possible to reduce power consumption occurring as static current flows over a long period of time by using a duobinary signal instead of an NRZ signal.

Additionally, frequency loss under the same channel conditions can be minimized by using a duobinary signaling instead of a di-code signaling.

In addition, voltage level spreading caused by inter-symbol interference (ISI) can be improved by employing a first equalization (EQ) for amplifying a duobinary signal to a voltage to be transitioned during voltage transition of the duobinary signal and a second EQ for saturating the signal to a predetermined voltage after the first EQ is applied.

The effects that can be obtained from the present disclosure are not limited to the effects mentioned above, and other effects that are not mentioned can be clearly understood by those skilled in the art from the description below.

BRIEF DESCRIPTION OF THE DRAWINGS

FIG. 11A-FIG. 11D are simulation results showing the effect of applying the first EQ and the second EQ to the duobinary signal.

DETAILED DESCRIPTION

Figure 1:
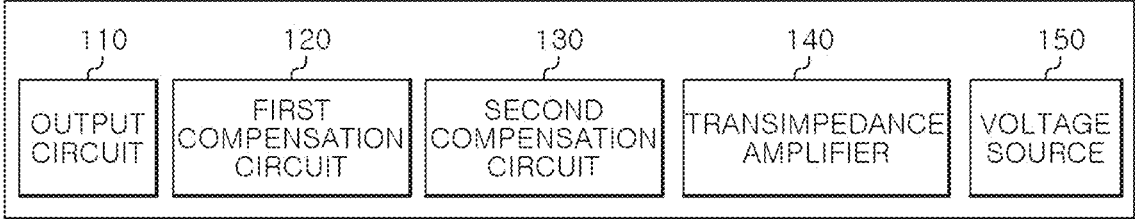
FIG. 1 is a block diagram illustrating a high-speed communication device based on a duobinary signal according to an embodiment of the first aspect of the present disclosure.

According to Nyquist theory, an original signal can be restored without loss by sampling the signal at regular intervals at a frequency that is twice the highest frequency included in the signal to be restored. Here, the frequency corresponding to half the sampling frequency is called a Nyquist frequency. In other words, the Nyquist frequency represents the maximum frequency that can be restored without loss from a sampled signal.

Since a duobinary signaling takes 1.5 times longer for voltage transition than an NRZ signaling, and considering that frequency is inversely proportional to the period, the Nyquist frequency of the NRZ signal can be 1.5 times higher than that of the duobinary signal. In addition, a di-code signaling which uses an encoding method similar to that of the duobinary signaling, has low-to-high transition, so the Nyquist frequency of the di-code signaling is the same as that of the NRZ signaling and can be 1.5 times higher than that of the duobinary signaling.

Here, since a channel can generally be modeled as a low-pass filter, a duobinary signaling with a Nyquist frequency 1.5 times lower than that of an NRZ signaling or a di-code signaling may have a bandwidth 1.5 times wider than that of the NRZ signaling or the di-code signaling when loss depending on frequency is considered. That is, the bandwidth of the di-code signaling has a lower limit compared to the bandwidth of the duobinary signaling.

Meanwhile, if a high voltage (1, high level data) signal is continuously generated with an NRZ signaling, power consumption may increase because static current flows for a long time. In this case, the problem of increased power consumption can be solved by using a di-code signaling instead of an NRZ signaling. Specifically, when a di-code signaling is used, continuously occurring 1s (high level data) are replaced with 0.5s (middle level data), and thus power consumption can be reduced.

Since a di-code signaling and a duobinary signaling use the same encoding method of replacing continuously occurring 1s (high level data) with 0.5s (middle level data) and processing the same, the same power consumption can be expected for sufficiently long arbitrary data for the two signaling. However, the Nyquist frequency of the di-code signal is higher than that of the duobinary signal, and thus there is a problem in that the di-code signaling has a frequency loss greater than that of the duobinary signaling under the same channel conditions.

The advantages and features of the embodiments and the methods of accomplishing the embodiments will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

Terms used in the present specification will be briefly described, and the present disclosure will be described in detail.

In terms used in the present disclosure, general terms currently as widely used as possible while considering functions in the present disclosure are used. However, the terms may vary according to the intention or precedent of a technician working in the field, the emergence of new technologies, and the like. In addition, in certain cases, there are terms arbitrarily selected by the applicant, and in this case, the meaning of the terms will be described in detail in the description of the corresponding invention. Therefore, the terms used in the present disclosure should be defined based on the meaning of the terms and the overall contents of the present disclosure, not just the name of the terms.

When it is described that a part in the overall specification "includes" a certain component, this means that other components may be further included instead of excluding other components unless specifically stated to the contrary.

In addition, a term such as a "unit" or a "portion" used in the specification means a software component or a hardware component such as FPGA or ASIC, and the "unit" or the "portion" performs a certain role. However, the "unit" or the "portion" is not limited to software or hardware. The "portion" or the "unit" may be configured to be in an addressable storage medium, or may be configured to reproduce one or more processors. Thus, as an example, the "unit" or the "portion" includes components (such as software components, object-oriented software components, class components, and task components), processes, functions, properties, procedures, subroutines, segments of program code, drivers, firmware, microcode, circuits, data, database, data structures, tables, arrays, and variables. The functions provided in the components and "unit" may be combined into a smaller number of components and "units" or may be further divided into additional components and "units".

Hereinafter, the embodiment of the present disclosure will be described in detail with reference to the accompanying drawings so that those of ordinary skill in the art may easily implement the present disclosure. In the drawings, portions not related to the description are omitted in order to clearly describe the present disclosure.

FIG. 1 is a block diagram illustrating a high-speed communication device based on a duobinary signal according to an embodiment of the first aspect of the present disclosure.

As illustrated in FIG. 1, the high-speed communication device 100 based on a duobinary signal according to an embodiment of the first aspect of the present disclosure may include an output circuit 110, a first compensation circuit 120, and a second compensation circuit 130. Additionally, in another embodiment, the high-speed communication device 100 based on a duobinary signal may further include a transimpedance amplifier 140 or a voltage source 150.

The output circuit 110 may output a duobinary signal. The duobinary signal may be a signal representing data with three levels of voltage, a high level voltage (1), a low level voltage (0), and a middle level voltage (0.5).

The transimpedance amplifier 140 may amplify the output duobinary signal.

The voltage source 150 may include a high level voltage source, a middle level voltage source, and a low level voltage source. The high level voltage source may supply a high level voltage to the output circuit, the first compensation circuit 120, and the second compensation circuit 130. The middle level voltage source may supply a middle level voltage to the output circuit, the first compensation circuit 120, and the second compensation circuit 130. The low level voltage source may supply a low level voltage to the output circuit, the first compensation circuit 120, and the second compensation circuit 130.

The output circuit 110 may include a first PMOS that supplies the high level voltage, a first NMOS that supplies the low level voltage, and a second PMOS and a second NMOS that supply the middle level voltage.

A first duobinary signal is applied to the gate of the first PMOS and the high level voltage source is connected to one node of the first PMOS such that the high level voltage can be supplied to the output node of the output circuit.

Additionally, a second duobinary signal is applied to the gate of the first NMOS and the low level voltage source is connected to one node of the first NMOS such that the low level voltage can be supplied to the output node.

Additionally, a third duobinary signal is applied to the gate of the second NMOS and the middle level voltage is applied to one node of the second NMOS such that the middle level voltage can be supplied to the output node.

Additionally, an inversion signal of the third duobinary signal is applied to the gate of the second PMOS and the middle level voltage is applied to one node of the second PMOS such that the middle level voltage can be supplied to the output node.

The first duobinary driving signal may be a signal output through a NAND operation circuit that receives the output signal during n UI (n being a natural number) and the output signal during n−1 UI and outputs a NAND operation result, and a NOT operation circuit that receives the output NAND operation result and outputs a result of 2m NOT operations (m being a natural number).

The second duobinary driving signal may be a signal output through a NAND operation circuit that receives the inversion signal of the output signal during n UI (n being a natural number) and the inversion signal of the output signal during n−1 UI and outputs a NAND operation result, and a NOT operation circuit that receives the output NAND operation result and outputs a result of 2m−1 NOT operations (m being a natural number).

The third duobinary driving signal may be a signal output through a third NOR operation circuit that receives a first NOR operation result obtained by inputting the output signal during n UI (n being a natural number) and the output signal during n−1 UI to a first NOR operation circuit and a second NOR operation result obtained by inputting the inversion signal of the output signal during n UI time and the inversion signal of the output signal during n−1 UI to a second NOR operation circuit and outputs a third NOR operation result, and a NOT operation circuit that receives the output third NOR operation result and outputs a result of 2m NOT operations (m being a natural number).

The inversion signal of the third duobinary driving signal may be a signal output through a third NAND operation circuit that receives a first NAND operation result obtained by inputting the output signal during n UI (n being a natural number) and the output signal during n−1 UI to a first NAND operation circuit and a second NAND operation result obtained by inputting the inversion signal of the output signal during n UI and the inversion signal of the output signal during n−1 UI to a second NAND operation circuit and outputs a third NAND operation result, and a NOT operation circuit that receives the output third NAND operation result and outputs a result of 2m NOT operations (m being a natural number).

In high-speed communication, communication performance may deteriorate due to various reasons. In this case, an equalization (EQ) method may be used to improve decreased signal quality. The equalization method may include pre-emphasis. Hereinafter, the above-described equalization will be referred to as EQ.

During voltage transition of the duobinary signal, the first compensation circuit 120 may apply a first EQ to the duobinary signal to amplify the duobinary signal to a voltage to be transitioned. At this time, the first EQ may be applied for one unit interval (UI).

The first compensation circuit 120 may include a (1-1)-th compensation circuit that applies a (1-1)-th EQ driving signal or (1-2)-th EQ driving signal to the duobinary signal to amplify the duobinary signal to a voltage to be transitioned during transition of the duobinary signal to a high level voltage or a low level voltage. Also, the first compensation circuit 120 may include a (1-3)-th compensation circuit that applies a (1-3)-th EQ driving signal or (1-4)-th EQ driving signal to the duobinary signal to amplify the duobinary signal to a voltage to be transitioned during transition of the duobinary signal to a middle level voltage from a high level voltage or a low level voltage. In other words, the duobinary signal may be amplified to a voltage to be transitioned based on the first EQ by using a (1-1)-th EQ driving signal, a (1-2)-th EQ driving signal, a (1-3)-th EQ driving signal, and a (1-4)-th EQ driving signal.

The (1-1)-th compensation circuit may comprise a (1-1)-th PMOS configured to supply the high level voltage and a (1-1)-th NMOS configured to supply the low level voltage. Here, the (1-1)-th PMOS may contain a gate to which a (1-1)-th EQ driving signal is applied and one node to which the high level voltage source is connected such that the high level voltage is supplied to the output node of the output circuit. Also, the (1-1)-th NMOS may contain a gate to which a (1-2)-th EQ driving signal is applied and one node to which the low level voltage source is connected such that the low level voltage is supplied to the output node.

The (1-1)-th EQ driving signal may be a signal output through a NAND operation circuit configured to receive a first NOR operation result obtained by inputting an output signal during n−2 UI (n being a natural number of 2 or more) and an inversion signal of an output signal during n−1 UI to a first NOR operation circuit and a second NOR operation result obtained by inputting an inversion signal of an output signal during n UI and an inversion signal of an operation signal for the (1-1)-EQ (the (1-1)-th EQ being activated when the operation signal is 1 and being deactivated when the operation signal is 0) to a second NAND operation circuit and output a NAND operation result, and a NOT operation circuit configured to receive the output NAND operation result and output a result of 2m NOT operations (m being a natural number).

The (1-2)-th EQ driving signal may be a signal output through a NOR operation circuit configured to receive a first NAND operation result obtained by inputting an output signal during n−2 UI (n being a natural number of 2 or more) and an inversion signal of an output signal during n−1 UI to a first NAND operation circuit and a second NAND operation result obtained by inputting an inversion signal of an output signal during n UI and an operation signal for the (1-1)-EQ (the (1-1)-th EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

The (1-3)-th compensation circuit may comprise a (1-3)-th PMOS configured to supply the high level voltage and a (1-3)-th NMOS configured to supply the low level voltage. Here, the (1-3)-th PMOS may contain a gate to which a (1-3)-th EQ driving signal is applied and one node to which the high level voltage source is connected such that the high level voltage is supplied to the output node of the output circuit. Also, the (1-3)-th NMOS may contain a gate to which a (1-4)-th EQ driving signal is applied and one node to which the low level voltage source is connected such that the low level voltage is supplied to the output node.

The (1-3)-th EQ driving signal may be a signal output through a NAND operation circuit configured to receive a first NOR operation result obtained by inputting an output signal during n−2 UI (n being a natural number of 2 or more) and an output signal during n−1 UI to a first NOR operation circuit and a second NOR operation result obtained by inputting an inversion signal of an output signal during n UI and an inversion signal of an operation signal for the (1-3)-EQ (the (1-3)-th EQ being activated when the operation signal is 1 and being deactivated when the operation signal is 0) to a second NOR operation circuit and output a NAND operation result, and a NOT operation circuit configured to receive the output NAND operation result and output a result of 2m NOT operations (m being a natural number).

The (1-4)-th EQ driving signal may be a signal output through a NOR operation circuit configured to receive a first NAND operation result obtained by inputting an output signal during n−2 UI (n being a natural number of 2 or more) and an output signal during n−1 UI to a first NAND operation circuit and a second NAND operation result obtained by inputting an inversion signal of an output signal during n UI and an operation signal for the (1-3)-EQ (the (1-3)-th EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

After completion of the first EQ, the second compensation circuit 130 may apply a second EQ for saturating the duobinary signal to a predetermined voltage. At this time, the second EQ may be applied for one or more UIs.

The second compensation circuit 130 may include a third PMOS that supplies the high level voltage and a third NMOS that supplies the low level voltage. A (2-1)-th EQ driving signal is applied to the gate of the third PMOS and the high level voltage source is connected to one node thereof such that the high level voltage can be supplied to the output node of the output circuit. Additionally, a (2-2)-th EQ driving signal is applied to the gate of the third NMOS and the low level voltage source is connected to one node thereof such that the low level voltage can be supplied to the output node. In other words, the duobinary signal may be saturated to a predetermined voltage based on the second EQ by using a (2-1)-th EQ driving signal and a (2-2)-th EQ driving signal.

The (2-1)-th EQ driving signal may be a signal output through a NAND operation circuit that receives a first NOR operation result obtained by inputting an output signal during n−1 UI (n being a natural number of 2 or more) and an output signal during n UI to a first NOR operation circuit and a second NOR operation result obtained by inputting an output signal during n−2 UI and an inversion signal of an operation signal for the second EQ (second EQ being activated when the operation signal is 1 and being deactivated when the operation signal is 0) to a second NOR operation circuit, and outputs a NAND operation result, and a NOT operation circuit that receives the output NAND operation result and outputs a result of m NOT operations (m being a natural number).

The (2-2)-th EQ driving signal may be a signal output through a NOR operation circuit that receives a first NAND operation result obtained by inputting an output signal during n–1 UI (n being a natural number of 2 or more) and an output signal during n UI to a first NAND operation circuit and a second NAND operation result obtained by inputting an output signal during n–2 UI and an inversion signal of the operation signal for the second EQ (the second EQ being activated when the operation signal is 1 and being deactivated when the operation signal is 0) to a second NAND operation circuit, and outputs a NOR operation result, and a NOT operation circuit that receives the output NOR operation result and outputs a result of 2m (m being a natural number) NOT operations.

Figure 2:
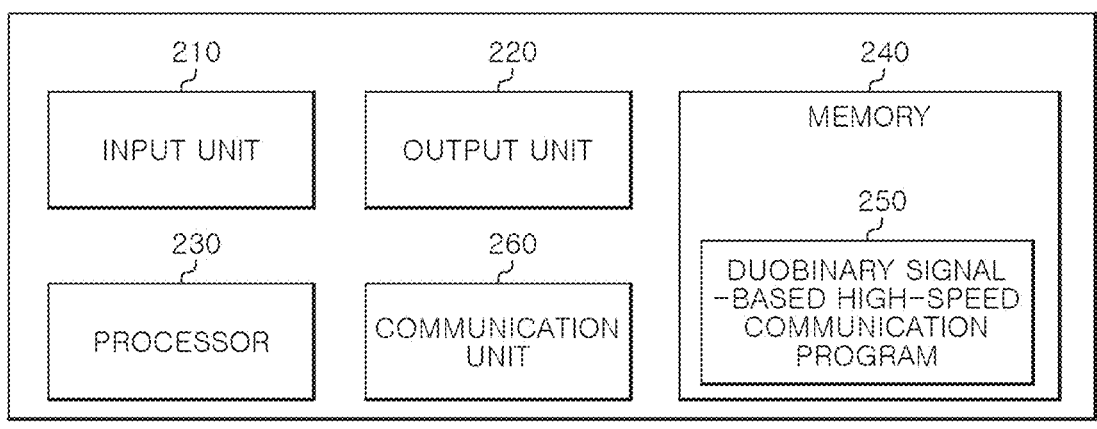
FIG. 2 is a block diagram illustrating a high-speed communication device based on a duobinary signal according to another embodiment of the first aspect of the present disclosure.

FIG. 2 is a block diagram illustrating a high-speed communication device based on a duobinary signal according to another embodiment of the first aspect of the present disclosure.

As illustrated in FIG. 2, the high-speed communication device 200 based on a duobinary signal may include an input unit 210, an output unit 220, a processor 230, a memory 240, and a communication unit 260.

Although an example in which the high-speed communication device 200 based on a duobinary signal includes the input unit 210, the output unit 220, the processor 230, the memory 240, and the communication unit 260 will be described below for convenience, the present disclosure is not limited thereto. That is, the components may be provided outside the high-speed communication device 200 based on a duobinary signal and operate in such a manner that they interact with the high-speed communication device 200 based on a duobinary signal.

The input unit 210 may include a user interface that receives commands, information, etc. used to control the high-speed communication device 200 based on a duobinary signal. Additionally, the input unit 210 may be a hardware device (e.g., a keyboard, a mouse, or the like) that can directly receive commands, information, etc. used to control the high-speed communication device 200 based on a duobinary signal.

In an embodiment, the input unit 210 may receive information required for a high-speed communication method based on a duobinary signal from a user. Specifically, the user may input information including information related to a duobinary signal and information related to the first EQ and the second EQ through the input unit 210.

The output unit 220 may provide information including the information related to the duobinary signal and information related to the first EQ and the second EQ to the user as visual information through an interface or a display device.

The processor 230 may control the overall operation of the high-speed communication device 200 based on a duobinary signal in order to perform the present disclosure.

In order to execute a duobinary signal-based high-speed communication program 250, the processor 230 may load the duobinary signal-based high-speed communication program 250 and information necessary to execute the duobinary signal-based high-speed communication program 250 from the memory 240.

The processor 230 may control data received from an external device through the communication unit 260 such that the data is stored in the memory 240. Additionally, the processor 230 may control information including the information related to the duobinary signal and the information related to the first EQ and the second EQ such that the information is transmitted/received to/from an external device through the communication unit 260.

The processor 230 may refer to a processing device such as a microprocessor, a central processing unit (CPU), a graphic processing unit (GPU), a processor core, a multiprocessor, an application-specific integrated circuit (ASIC), a field programmable gate array (FPGA), or a micro controller unit (MCU), but the present disclosure is not limited thereto.

The memory 240 may store the duobinary signal-based high-speed communication program 250 and information necessary to execute the duobinary signal-based high-speed communication program 250. Additionally, the memory 240 may store results of processing performed by the processor 230.

The duobinary signal-based high-speed communication program 250 may refer to software including instructions programmed to perform a method according to the present disclosure.

The memory 240 may store information including the information related to the duobinary signal and the information related to the first EQ and the second EQ. Additionally, the memory 240 may store information received from an external device through the communication unit 260.

The memory 240 may refer to a computer-readable recording medium such as magnetic media such as a hard disk, a floppy disc, and a magnetic tape, optical media such as a CD-ROM and a DVD, magneto-optical media such as a floptical disk, a random access memory such as a dynamic random access memory (DRAM) or a static random access memory (SRAM), or a hardware device specially configured to store and execute program instructions, such as a flash memory, but the present disclosure is not limited thereto.

The communication unit 260 may be a wireless communication module capable of performing wireless communication by adopting a communication method such as CDMA, GSM, W-CDMA, TD-SCDMA, WiBro, LTE, EPC, 5G, wireless LAN, Wi-Fi, Bluetooth, ZigBee, Wi-Fi Direct (WFD), Ultra Wide Band (UWB), infrared data association (IrDA), Bluetooth Low Energy (BLE), or near field communication (NFC), but the present disclosure is not limited thereto.

In addition, information input and output through the input unit 210 and the output unit 220, information stored in the memory 240, and information transmitted and received through the communication unit 260 include all information related to the present disclosure, but are not limited to the above-described embodiments.

The function or operation of the duobinary signal-based high-speed communication program 250 will be described in detail with reference to FIG. 3.

Figure 3:
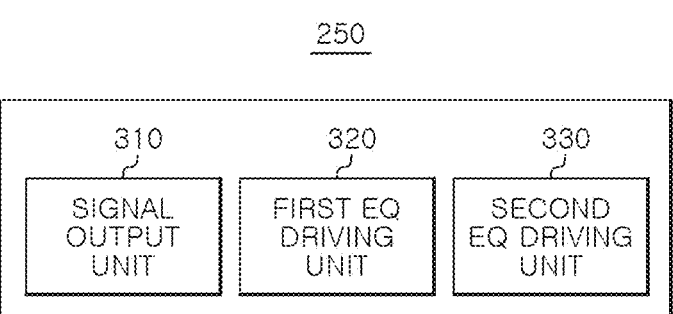
FIG. 3 is a block diagram illustrating the functions of the duobinary signal-based high-speed communication program.

FIG. 3 is a block diagram illustrating the functions of the duobinary signal-based high-speed communication program.

As illustrated in FIG. 3, the duobinary signal-based high-speed communication program 250 may include a signal output unit 310, a first EQ driving unit 320, and a second EQ driving unit 330. The signal output unit 310, the first EQ driving unit 320, and the second EQ driving unit 330 are exemplary divisions of the functions of the duobinary signal-based high-speed communication program 250, and the present disclosure is not limited thereto.

According to an embodiment, the functions of the signal output unit 310, the first EQ driving unit 320, and the second EQ driving unit 330 may be merged/separated, and may be implemented as a series of instructions included in at least one program.

The signal output unit 310, the first EQ driving unit 320, and the second EQ driving unit 330 may be implemented by the processor 230 and may refer to a data processing device built in hardware that has a physically structured circuit to perform functions represented by code or instructions included in the duobinary signal-based high-speed communication program 250 stored in the memory 240.

The signal output unit 310 may output a duobinary signal.

The signal output unit 310 may include a first PMOS that supplies a high level voltage, a first NMOS that supplies a low level voltage, and a second PMOS and a second NMOS that supply a middle level voltage. Here, the description of the first PMOS, the second PMOS, the first NMOS, and the second NMOS will be replaced with the description of the first PMOS, the second PMOS, the first NMOS, and the second NMOS illustrated in FIG. 1.

During voltage transition of the duobinary signal, the first EQ driving unit 320 may apply the first EQ to amplify the duobinary signal to a voltage to be transitioned. In addition, the first EQ driving unit 320 may include a (1-1)-th compensation circuit that applies a (1-1)-th EQ driving signal or (1-2)-th EQ driving signal to amplify the duobinary signal to a voltage to be transitioned during transition of the duobinary signal to a high level voltage or a low level voltage, and a (1-3)-th compensation circuit that applies a (1-3)-th EQ driving signal or (1-4)-th EQ driving signal to amplify the duobinary signal to a voltage to be transitioned during transition of the duobinary signal to a middle level voltage from a high level voltage or a low level voltage. Here, the description of the first EQ, (1-1)-th EQ, (1-3)-th EQ, (1-1)-th compensation circuit, and (1-3)-th compensation circuit will be replaced with the description of the first EQ, (1-1)-th EQ, (1-3)-th EQ, (1-1)-th compensation circuit, and (1-3)-th compensation circuit illustrated in FIG. 1.

After completion of the first EQ, the second EQ driving unit 330 may apply the second EQ to saturate the duobinary signal to a predetermined voltage. Additionally, the second EQ driving unit 330 may include a third PMOS that supplies the high level voltage and a third NMOS that supplies the low level voltage. Here, the description of the second EQ, the third PMOS, and the third NMOS will be replaced with the description of the second EQ, the third PMOS, and the third NMOS illustrated in FIG. 1.

Figure 4:
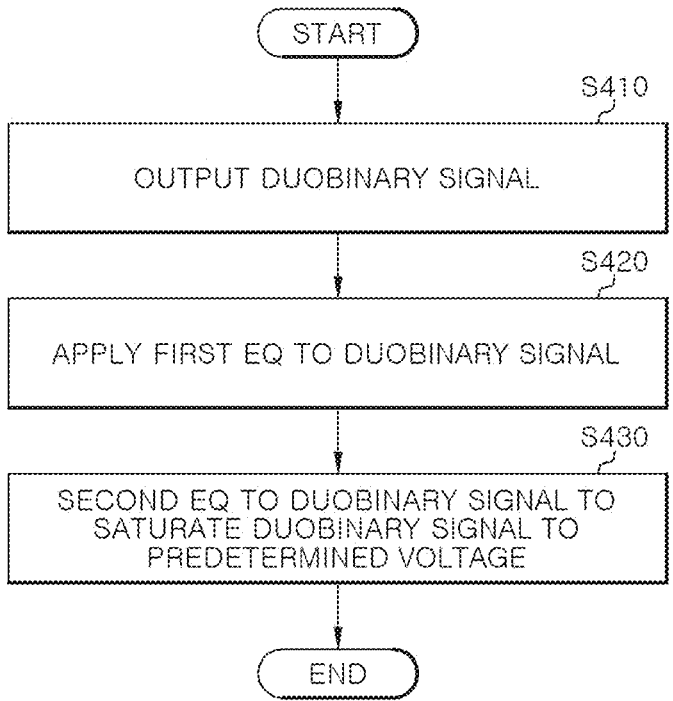
FIG. 4 is a flowchart illustrating a high-speed communication method based on a duobinary signal according to the first aspect of the present disclosure.

FIG. 4 is a flowchart illustrating a high-speed communication method based on a duobinary signal according to the first aspect of the present disclosure. It is assumed that the duobinary signal-based high-speed communication method is performed by the duobinary signal-based high-speed communication device.

As shown in FIG. 4, the duobinary signal-based high-speed communication method according to the first aspect of the present disclosure includes step S410 of outputting a duobinary signal, step S420 of applying the first EQ to amplify the duobinary signal to a voltage to be transitioned during voltage transition of the duobinary signal, and step S430 of applying the second EQ to saturate the duobinary signal to a predetermined voltage after completion of the first EQ is applied.

Figure 5:
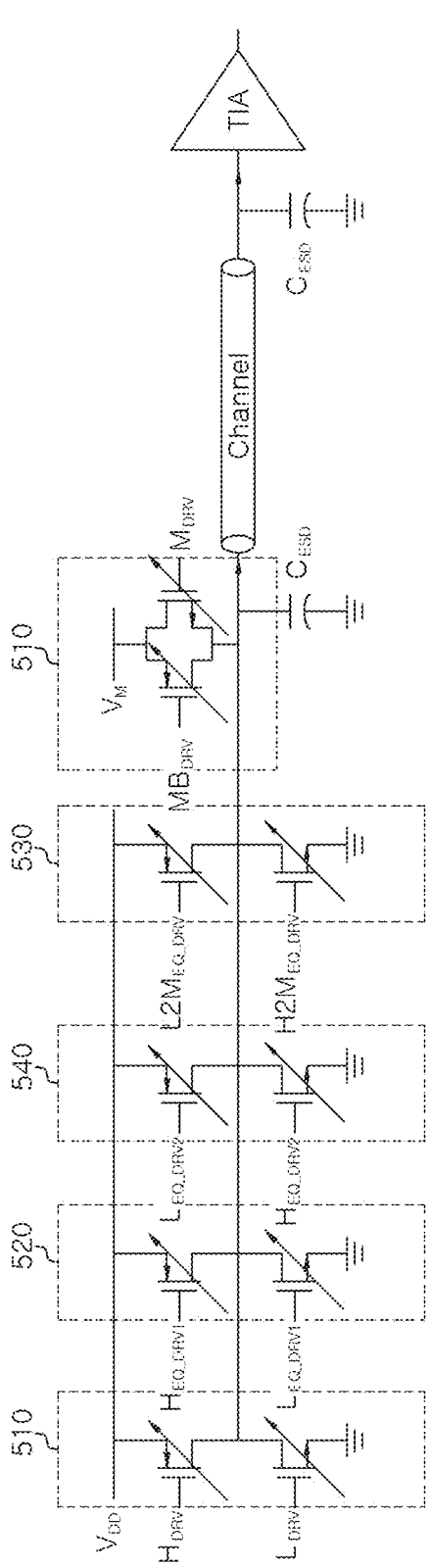
FIG. 5 is an exemplary diagram showing a circuit for performing the duobinary signal-based high-speed communication method according to the present disclosure.

FIG. 5 is an exemplary diagram showing a circuit for performing the duobinary signal-based high-speed communication method according to the present disclosure.

As shown in FIG. 5, the circuit for performing the duobinary signal-based high-speed communication method according to the present disclosure may include an output circuit 510 that outputs a duobinary signal, a (1-1)-th compensation circuit 520 that applies the (1-1)-th EQ to amplify the duobinary signal to a voltage to be transitioned during voltage transition of the duobinary signal to the high level voltage or the low level voltage, a (1-3)-th compensation circuit 530 that applies the (1-3)-th EQ to amplify the duobinary signal to a voltage to be transitioned during voltage transition of the duobinary signal to the middle level voltage, and a second compensation circuit 540 that applies the second EQ to saturate the duobinary signal after completion of the (1-1)-th EQ and the (1-3)-th EQ.

The output circuit 510 may include a first PMOS that supplies a high level voltage, a first NMOS that supplies a low level voltage, and a second PMOS and a second NMOS that supply a middle level voltage.

A first duobinary driving signal is applied to the gate of the first PMOS and a high level voltage source is connected to one node thereof such that the high level voltage can be supplied to the output node of the output circuit. In FIG. 5, $H_{DRV}$ represents the first duobinary driving signal.

Additionally, a second duobinary driving signal is applied to the gate of the first NMOS and a low level voltage source is connected to one node thereof such that the low level voltage can be supplied to the output node. In FIG. 5, $L_{DRV}$ represents the second duobinary driving signal.

Additionally, a third duobinary driving signal is applied to the gate of the second NMOS and the middle level voltage is applied to one node thereof such that the middle level voltage can be supplied to the output node. In FIG. 5, $M_{DRV}$ represents the third duobinary driving signal.

Further, an inversion signal of the third duobinary driving signal is applied to the gate of the second PMOS and the middle level voltage is applied one node thereof such that the middle level voltage can be supplied to the output node. In FIG. 5, $MB_{DRV}$ represents the inversion signal of the third duobinary driving signal.

The (1-1)-th compensation circuit 520 may include a (1-1)-th PMOS that supplies the high level voltage and a (1-1)-th NMOS that supplies the low level voltage.

A (1-1)-th EQ driving signal is applied to the gate of the (1-1)-th PMOS and a high level voltage source is connected to one node thereof such that the high level voltage can be supplied to the output node of the output circuit. In FIG. 5, $H_{EQ\_DRV1}$ represents the (1-1)-th EQ driving signal.

Further, a (1-2)-th EQ driving signal is applied to the gate of the (1-1)-th NMOS and a low level voltage source is connected to one node thereof such that the low level voltage can be supplied to the output node. In FIG. 5, $L_{EQ\_DRV1}$ represents the (1-2)-th EQ driving signal.

The (1-3)-th compensation circuit 530 may include a (1-3)-th PMOS that supplies the high level voltage and a (1-3)-th NMOS that supplies the low level voltage.

A (1-3)-th EQ driving signal is applied to the gate of the (1-3)-th PMOS and the high level voltage source is connected to one node thereof such that the high level voltage can be supplied to the output node of the output circuit. In FIG. 5, $L2M_{EQ\_DRV}$ represents the (1-3)-th EQ driving signal.

In addition, a (1-4)-th EQ driving signal is applied to the gate of the (1-3)-th NMOS and the low level voltage source is connected to one node thereof such that the low level voltage can be supplied to the output node. In FIG. 5, $H2M_{EQ\_DRV}$ represents the (1-4)-th EQ driving signal.

The second compensation circuit 540 may include a third PMOS that supplies the high level voltage and a third NMOS that supplies the low level voltage.

A (2-1)-th EQ driving signal is applied to the gate of the third PMOS and the high level voltage source is connected to one node thereof such that the high level voltage can be supplied to the output node of the output circuit. In FIG. 5, $L_{EQ\_DRV2}$ represents the (2-1)-th EQ driving signal.

A (2-2)-th EQ driving signal is applied to the gate of the third NMOS and the low level voltage source is connected to one node thereof such that the low level voltage can be supplied to the output node. In FIG. 5, $H_{EQ\_DRV2}$ represents the (2-2)-th EQ driving signal.

One or more PMOSs and NMOSs may be provided in FIG. 5. That is, a plurality of PMOSs and NMOSs may be used depending on an embodiment.

Figure 6:
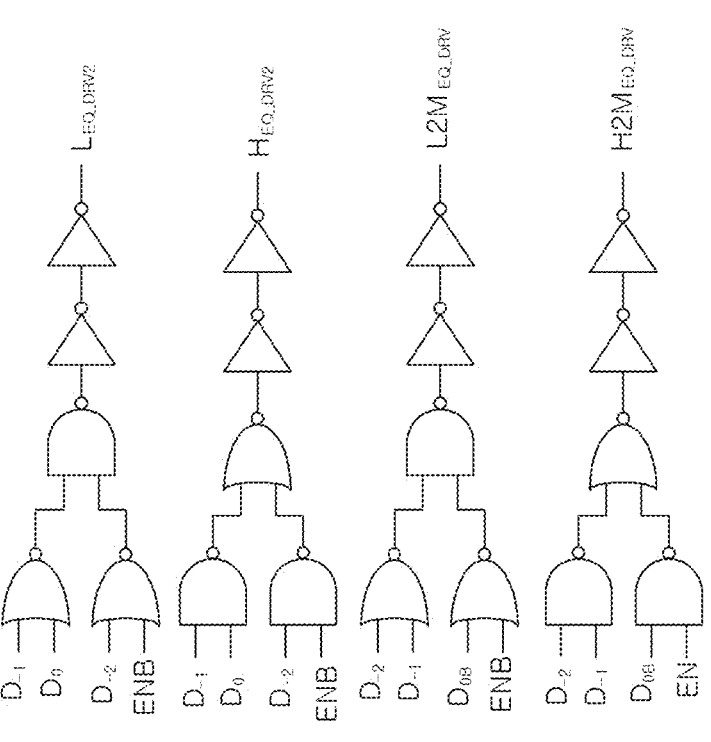
FIG. 6 is an exemplary circuit diagram showing a method of encoding driving signals for driving a duobinary signal, the first EQ, and the second EQ.
Figure 6:
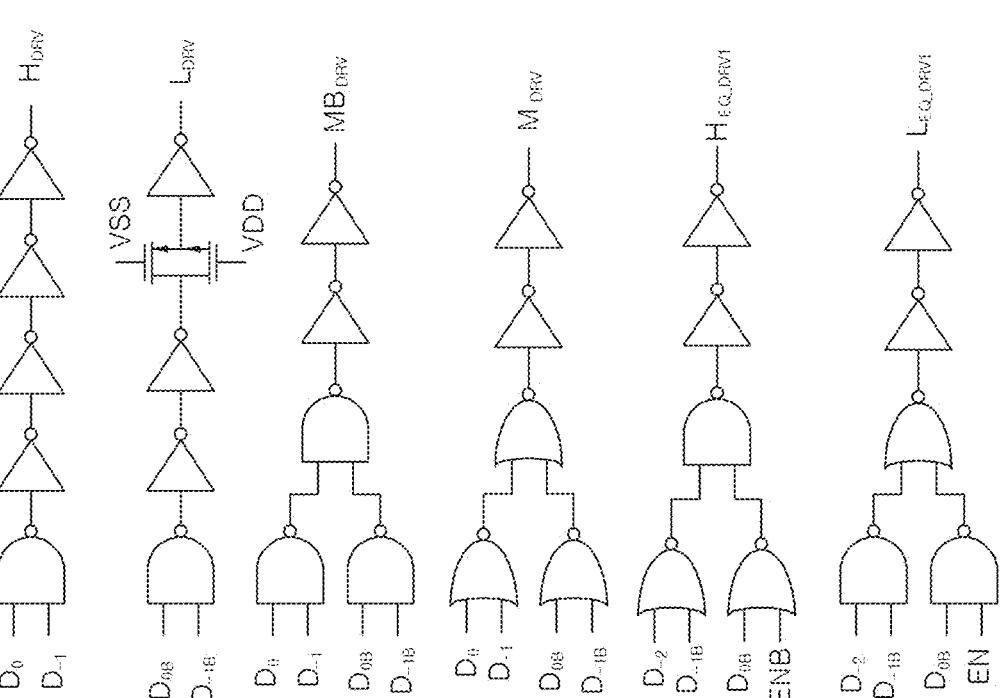

FIG. 6 is an exemplary circuit diagram showing a method of encoding driving signals for driving a duobinary signal, the first EQ, and the second EQ.

As described with reference to FIG. 5, $H_{DRV}$ represents the first duobinary driving signal, $L_{DRV}$ represents the second duobinary driving signal, $M_{DRV}$ represents the third duobinary driving signal, $MB_{DRV}$ represents the inversion signal of the third duobinary driving signal, $H_{EQ\_DRV1}$ represents the (1-1)-th EQ driving signal, $L_{EQ\_DRV1}$ represents the (1-2)-th EQ driving signal, $L2M_{EQ\_DRV}$ represents the (1-3)-th EQ driving signal, $H2M_{EQ\_DRV}$ represents the (1-4)-th EQ driving signal, $L_{EQ\_DRV2}$ represents the (2-1)-th EQ driving signal, and $H_{EQ\_DRV2}$ represents the (2-2)-th EQ driving signal.

In FIG. 6, $D_0$ represents the output signal during n UI, $D_{-1}$ represents the output signal during n–1 UI, $D_{-2}$ represents the output signal during n–2 UI, EN represents the operation signal for the corresponding EQ (the EQ being activated when it is 1 and being deactivated when it is 0), and B represents an inversion signal.

The first duobinary driving signal $H_{DRV}$ may be a signal output through a NAND operation circuit that receives the output signal during n UI (n being a natural number) and the output signal during n–1 UI and outputs a NAND operation result, and a NOT operation circuit that receives the output NAND operation result and outputs a result of 2m NOT operations (m being a natural number).

The second duobinary driving signal $L_{DRV}$ may be a signal output through a NAND operation circuit that receives the inversion signal of the output signal during n UI (n being a natural number) and the inversion signal of the output signal during n–1 UI and outputs a NAND operation result, and a NOT operation circuit that receives the output NAND operation result and outputs a result of 2m–1 NOT operations (m being a natural number).

The third duobinary driving signal $M_{DRV}$ may be a signal output through a third NOR operation circuit that receives a first NOR operation result obtained by inputting the output signal during n UI (n being a natural number) and the output signal during n–1 UI to a first NOR operation circuit and a second NOR operation result obtained by inputting the inversion signal of the output signal during n UI time and the inversion signal of the output signal during n–1 UI to a second NOR operation circuit and outputs a third NOR operation result, and a NOT operation circuit that receives the output third NOR operation result and outputs a result of 2m NOT operations (m being a natural number).

The inversion signal $MB_{DRV}$ of the third duobinary driving signal may be a signal output through a third NAND operation circuit that receives a first NAND operation result obtained by inputting the output signal during n UI (n being a natural number) and the output signal during n–1 UI to a first NAND operation circuit and a second NAND operation result obtained by inputting the inversion signal of the output signal during n UI and the inversion signal of the output signal during n–1 UI to a second NAND operation circuit and outputs a third NAND operation result, and a NOT operation circuit that receives the output third NAND operation result and outputs a result of 2m NOT operations (m being a natural number).

The (1-1)-th EQ driving signal $H_{EQ\_DRV1}$ may be a signal output through a NAND operation circuit that receives a first NOR operation result obtained by inputting the output signal during n–2 UI (n being a natural number of 2 or more) and the inversion signal of the output signal during n–1 UI to the first NOR operation circuit and a second NOR operation result obtained by inputting the inversion signal of the output signal during n UI and the operation signal for the (1-1)-th EQ (the (1-1)-th EQ being activated when the operation signal is 1 and being deactivated when the operation signal is 0) to the second NOR operation circuit, and outputs a NAND operation result, and a NOT operation circuit that receives the output NAND operation result and outputs a result of 2m NOT operations (m being a natural number).

The (1-2)-th EQ driving signal $L_{EQ\_DRV1}$ may be a signal output through a NOR operation circuit that receives a first NAND operation result obtained by inputting the output signal during n–2 UI (n being a natural number of 2 or more) and the inversion signal of the output signal during n–1 UI to the first NAND operation circuit and a second NAND operation result obtained by inputting the inversion signal of the output signal during n UI and the operation signal for the (1-1)-th EQ (the (1-1)-th EQ being activated when the operation signal is 1 and being deactivated when the operation signal is 0) to the second NAND operation circuit, and outputs a NOR operation result, and a NOT operation circuit that receives the output NOR operation result and outputs a result of 2m NOT operations (m being a natural number).

The (1-3)-th EQ driving signal $L2M_{EQ\_DRV}$ may be a signal output through a NAND operation circuit that receives a first NOR operation result obtained by inputting the output signal during n–2 UI (n being a natural number of 2 or more) and the output signal during n–1 UI to the first NOR operation circuit and a second NOR operation result obtained by inputting an inversion signal of a output signal during n UI and an inversion signal of an operation signal for the (1-3)-th EQ (the (1-3)-th EQ being activated when the operation signal is 1 and being deactivated when the operation signal is 0) to the second NOR operation circuit, and outputs a NAND operation result, and a NOT operation circuit that receives the output NAND operation result and outputs a result of 2m NOT operations (m being a natural number).

The (1-4)-th EQ driving signal $H2M_{EQ\_DRV}$ may be a signal output through a NOR operation circuit that receives a first NAND operation result obtained by inputting the output signal during n–2 UI (n being a natural number of 2 or more) and the output signal during n–1 UI to the first NAND operation circuit and a second NAND operation result obtained by inputting an inversion signal of an output signal during n UI and an operation signal for the (1-3)-th EQ (the (1-3)-th EQ being activated when the operation signal is 1 and being deactivated when the operation signal is 0) to the second NAND operation circuit, and outputs a NOR operation result, and a NOT operation circuit that receives the output NOR operation result and outputs a result of 2m NOT operations (m being a natural number).

The (2-1)-th EQ driving signal $L_{EQ\_DRV2}$ may be a signal output through a NAND operation circuit that receives a first NOR operation result obtained by inputting the output signal during n−1 UI (n being a natural number of 2 or more) and the output signal during n UI to the first NOR operation circuit and a second NOR operation result obtained by inputting the output signal during n−2 UI and an inversion signal of an operation signal for the second EQ (the second EQ being activated when the operation signal is 1 and being deactivated when the operation signal is 0) to the second NOR operation circuit, and outputs a NAND operation result, and a NOT operation circuit that receives the output NAND operation result and outputs a result of 2m NOT operations (m being a natural number).

The (2-2)-th EQ driving signal $H_{EQ\_DRV2}$ may be a signal output through a NOR operation circuit that receives a first NAND operation result obtained by inputting the output signal during n−1 UI (n being a natural number of 2 or more) and the output signal during n UI to the first NAND operation circuit and a second NAND operation result obtained by inputting the output signal during n−2 UI and the inversion signal of the operation signal for the second EQ (the second EQ being activated when the operation signal is 1 and being deactivated when the operation signal is 0) to the second NAND operation circuit, and outputs a NOR operation result, and a NOT operation circuit that receives the output NOR operation result and outputs a result of 2m NOT operations (m being a natural number).

Figure 7:
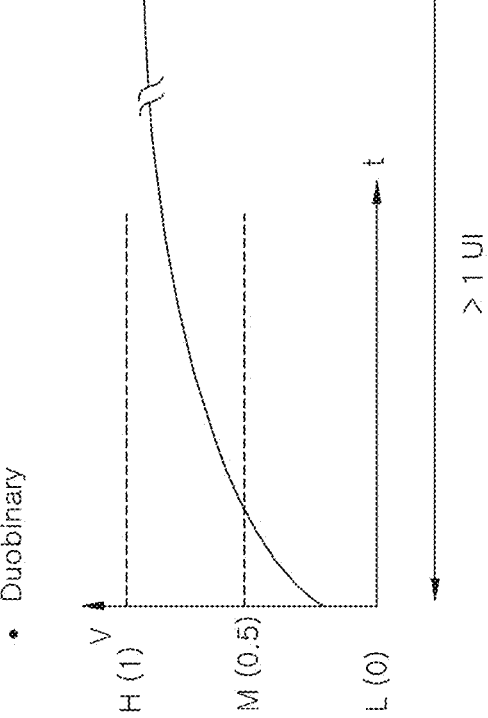
FIG. 7 is an exemplary diagram illustrating the difference in transient response between a di-code signal and a duobinary signal during transition from a low level signal to a high level signal.
Figure 7:
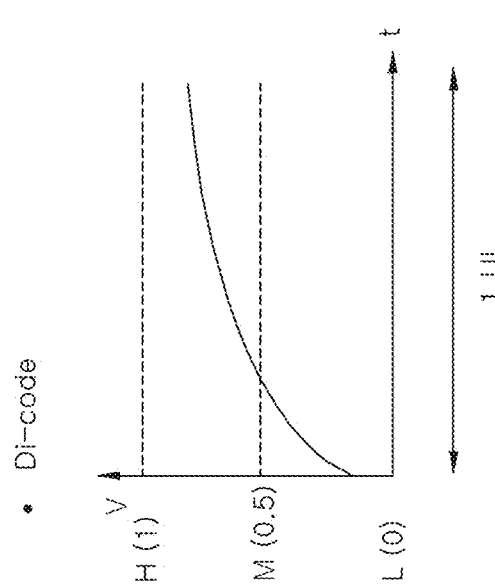

FIG. 7 is an exemplary diagram illustrating the difference in transient response between a di-code signal and a duobinary signal during transition from a low level signal to a high level signal.

Unlike the di-code signal, the duobinary signal may have a period in which the high level voltage or the low level voltage is maintained for two or more UIs. Accordingly, a problem that a voltage does not constantly saturate and continues to change, that is, voltage level spreading due to inter-symbol interference (ISI), may occur.

Figure 8:
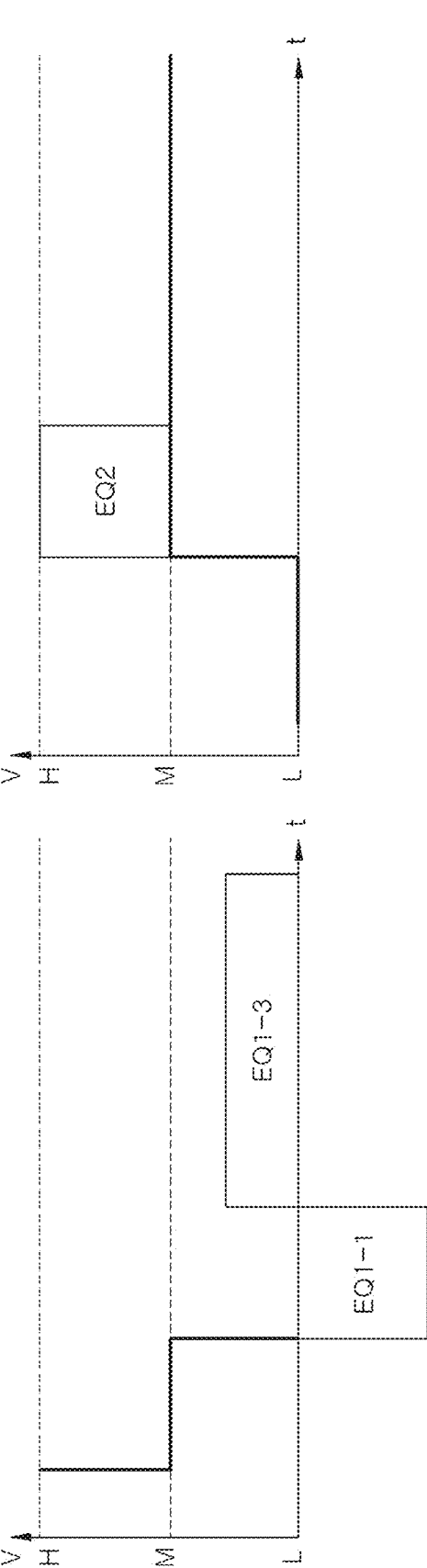
FIG. 8 is an exemplary diagram showing timings of the first EQ and the second EQ.

FIG. 8 is an exemplary diagram showing timings of the first EQ and the second EQ.

The first EQ may include the (1-1)-th EQ and the (1-3)-th EQ. Here, the (1-1)-th EQ may perform a function of amplifying the duobinary signal to a voltage to be transitioned during transition of the duobinary signal to the high level voltage or the low level voltage. In addition, the (1-3)-th EQ may perform a function of amplifying the duobinary signal to a voltage to be transitioned during transition of the duobinary signal to the middle level voltage. The first EQ may be applied for one UI.

The second EQ may be applied to improve voltage level spreading that may occur when the duobinary signal described above is used in FIG. 7. Here, the second EQ may perform a function of saturating the duobinary signal to a predetermined voltage after completion of the first EQ. The second EQ may be applied for two or more UIs in consideration of the characteristics of the duobinary signal that can maintain the same voltage for two or more UIs.

Figure 9:
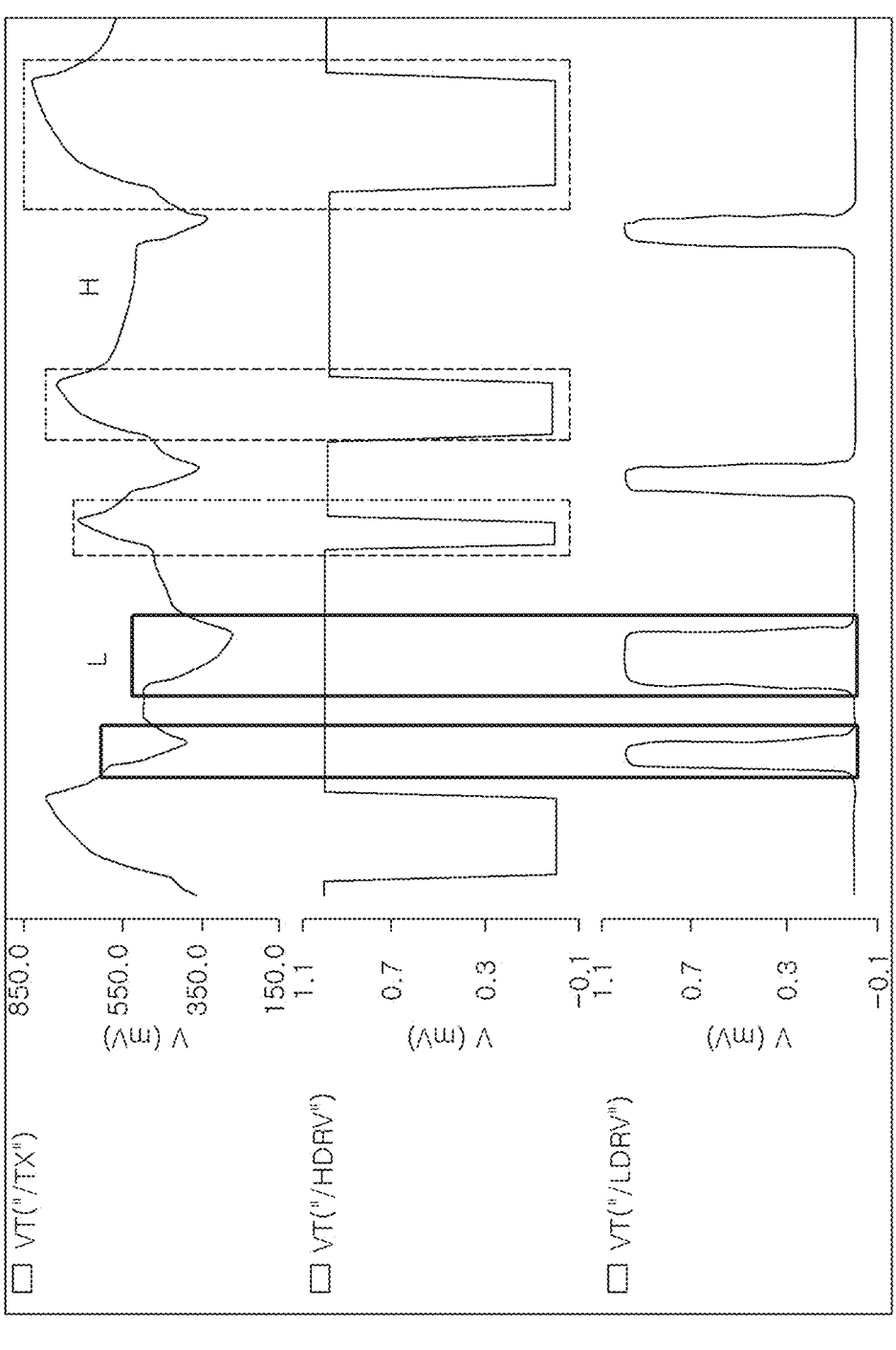
FIG. 9 is a simulation result showing the voltage transition of the duobinary signal.

FIG. 9 is a simulation result showing the voltage transition of the duobinary signal.

As illustrated in FIG. 7, the duobinary signal may have a period in which the high level voltage or the low level voltage is maintained for two or more UIs. Accordingly, a problem that a voltage does not constantly saturate and continues to change, that is, voltage level spreading due to inter-symbol interference (ISI), may occur.

Figure 10:
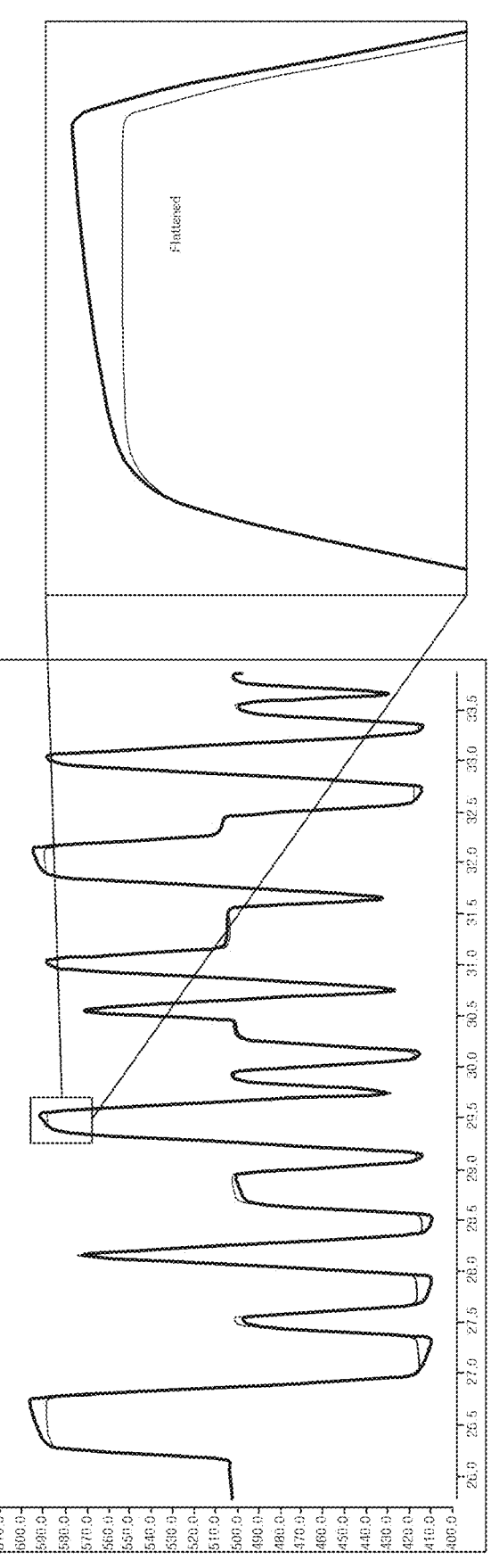
FIG. 10 is a simulation result showing saturation of the duobinary to a predetermined voltage when the second EQ is used.

FIG. 10 is a simulation result showing saturation of the duobinary to a predetermined voltage when the second EQ is used.

To improve voltage level spreading described above shown in FIG. 9, the second EQ may be applied. Here, the second EQ may perform the function of saturating the duobinary signal to a predetermined voltage after the first EQ.

As can be ascertained from FIG. 10, in the case of a signal to which the second EQ is not applied, the voltage level continues to rise, but in the case of a signal to which the second EQ is applied, the voltage level saturates to a predetermined level.

FIG. 11A-FIG. 11D are simulation results showing the effect of applying the first EQ and the second EQ to the duobinary signal.

Figures 11A, 11B, 11C, 11D:
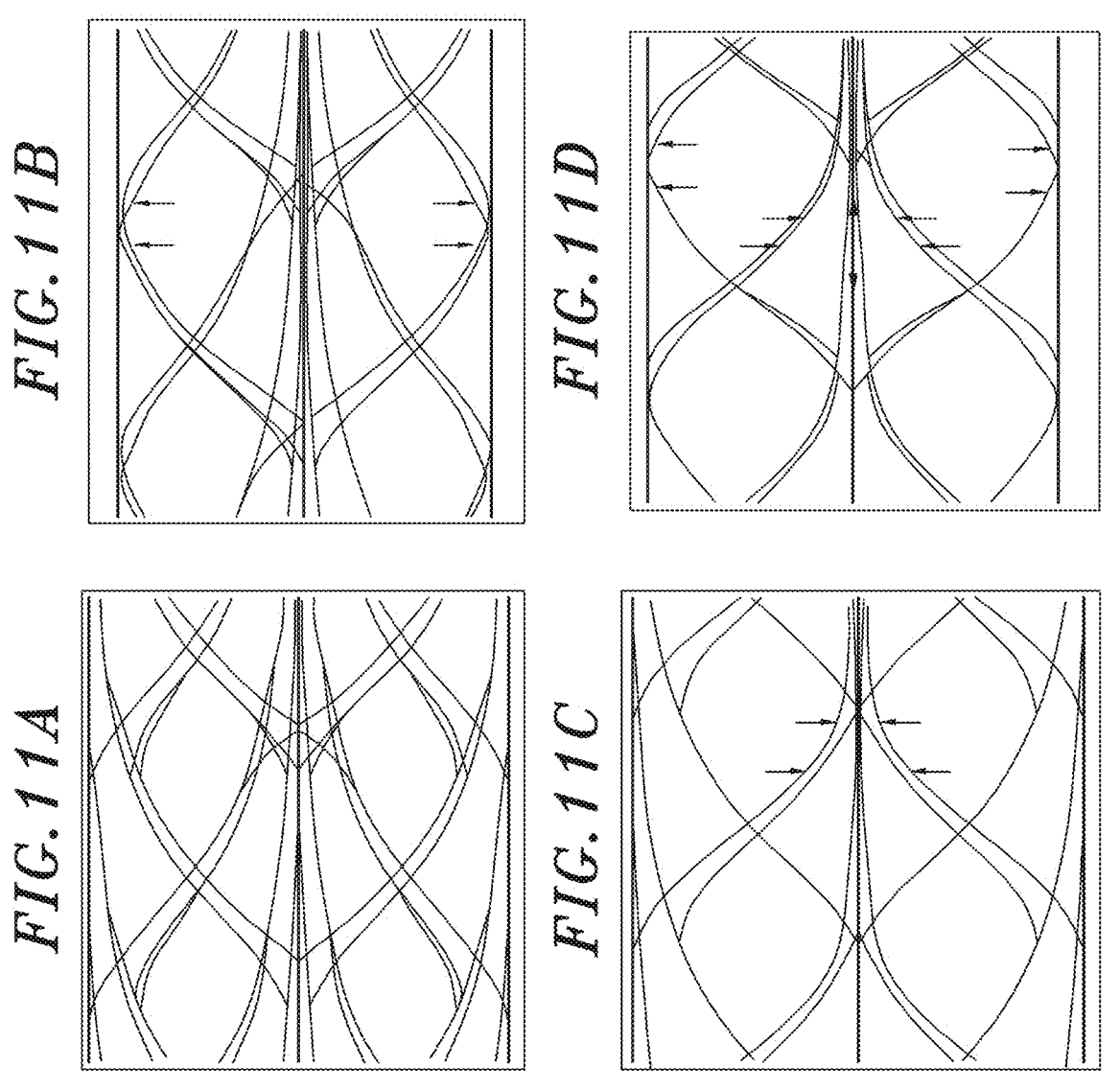

FIG. 11A shows data to which EQ is not applied, FIG. 11B shows data to which the first EQ is applied, FIG. 11C shows data to which the second EQ is applied, and FIG. 11D shows data to which the first EQ and the second EQ are applied.

As can be ascertained from FIG. 11B, when the first EQ is applied, signal transition occurs more rapidly as the signal is amplified to the voltage to be transitioned.

As can be ascertained from FIG. 11C, when the second EQ is applied, the signal rapidly saturates to a predetermined voltage.

As can be ascertained from FIG. 11D, when the first EQ and the second EQ are applied, signal transition occurs more rapidly as the signal is amplified to a voltage to be transitioned, and the signal rapidly saturates to a predetermined voltage.

Figure 12A:
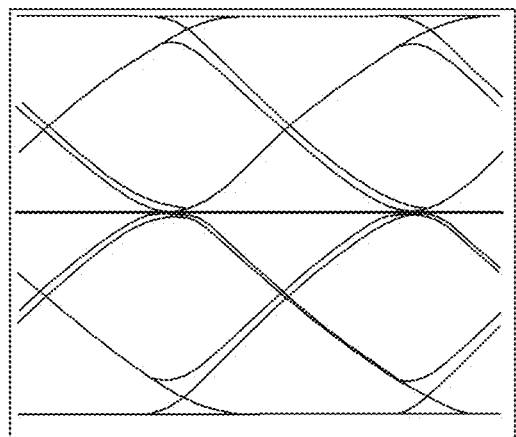
FIG. 12A and FIG. 12B are simulation results showing the results of comparison between eye diagrams after applying both the first EQ and the second EQ to the duobinary signal and the di-code signal.
Figure 12B:
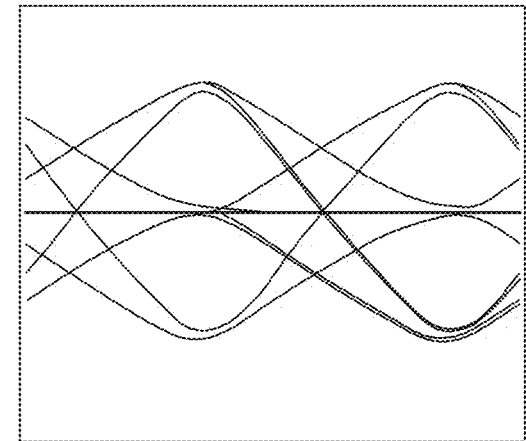

FIG. 12A and FIG. 12B are simulation results showing the results of comparison between eye diagrams after applying both the first EQ and the second EQ to the duobinary signal and the di-code signal.

It is confirmed that the duobinary signal (FIG. 12A) generated according to the high-speed communication method based on a duobinary signal according to the present disclosure uses less power than the di-code signal (FIG. 12B) and has an eye increased about twice that of the di-code signal. If the eye becomes small, the signal may not be transmitted effectively because the voltage value is not constant in a situation of rapid voltage transition. That is, as the eye increases, the signal can be transmitted more effectively in high-speed communication.

In addition, the areas of the eyes were calculated through the areas of squares having four points formed according to the simulation graphs of FIGS. 12(a) and 12(b) as vertices, and the eyes calculated with respect to the duobinary signal and di-code signal were compared relative to each other.

Table 1 below shows the power consumption and relative eye areas of the duobinary signal and the di-code signal.

TABLE 1

|  | Duobinary signal | Di-code signal |
| --- | --- | --- |
| Power consumption (μW) | 296.7 | 318.5 |
| Relative eye area | 4158.95 | 2066.11 |

As described above, according to the present disclosure, power consumption occurring as static current flows over a long period of time can be reduced by using a duobinary signal instead of an NRZ signal.

Additionally, according to the present disclosure, frequency loss can be reduced under the same channel conditions by using a duobinary signal instead of a di-code signal.

In addition, according to the present disclosure, it is possible to improve voltage level spreading due to inter-symbol interference (ISI) by using the first EQ for amplifying a duobinary signal to a voltage to be transitioned during voltage transition of the duobinary signal and the second EQ for saturating the signal to a predetermined voltage after completion of the first EQ.

Embodiments of the present disclosure described above can be implemented through various means. For example, embodiments of the present disclosure may be implemented by hardware, firmware, software, or a combination thereof.

Combinations of steps in each flowchart attached to the present disclosure may be executed by computer program instructions. Since the computer program instructions can be mounted on a processor of a general-purpose computer, a special purpose computer, or other programmable data processing equipment, the instructions executed by the processor of the computer or other programmable data processing equipment create a means for performing the functions described in each step of the flowchart. The computer program instructions can also be stored on a computer-usable or computer-readable storage medium which can be directed to a computer or other programmable data processing equipment to implement a function in a specific manner. Accordingly, the instructions stored on the computer-usable or computer-readable recording medium can also produce an article of manufacture containing an instruction means which performs the functions described in each step of the flowchart. The computer program instructions can also be mounted on a computer or other programmable data processing equipment. Accordingly, a series of operational steps are performed on a computer or other programmable data processing equipment to create a computer-executable process, and it is also possible for instructions to perform a computer or other programmable data processing equipment to provide steps for performing the functions described in each step of the flowchart.

In addition, each step may represent a module, a segment, or a portion of codes which contains one or more executable instructions for executing the specified logical function(s). It should also be noted that in some alternative embodiments, the functions mentioned in the steps may occur out of order. For example, two steps illustrated in succession may in fact be performed substantially simultaneously, or the steps may sometimes be performed in a reverse order depending on the corresponding function.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A high-speed communication device based on a duobinary signal comprising:

an output circuit configured to output a duobinary signal;

a first compensation circuit configured to apply a first equalization (EQ) for amplifying the duobinary signal to a voltage to be transitioned during voltage transition of the duobinary signal;

a second compensation circuit configured to apply a second EQ for saturating the duobinary signal to a predetermined voltage after the first EQ is applied;

a high level voltage source configured to supply a high level voltage to the output circuit, the first compensation circuit, and the second compensation circuit;

a low level voltage source configured to supply a low level voltage to the output circuit, the first compensation circuit, and the second compensation circuit; and a middle level voltage source configured to supply a middle level voltage to the output circuit, the first compensation circuit, and the second compensation circuit, wherein the first compensation circuit includes:

a (1-1)-th compensation circuit configured to apply a (1-1)-th EQ for amplifying the duobinary signal to a voltage to be transitioned during transition of the duobinary signal to the high level voltage or the low level voltage; and a (1-3)-th compensation circuit configured to apply a (1-3)-th EQ for amplifying the duobinary signal to a voltage to be transitioned during transition of the duobinary signal to the middle level voltage.

2. The device of claim 1, wherein the duobinary signal includes a signal representing data with the high level voltage, the low level voltage, and the middle level voltage.

3. The device of claim 1, further comprising a transimpedance amplifier (TIA) configured to amplify the output duobinary signal.

4. The device of claim 1, wherein the first EQ is configured to be applied for one unit interval (UI), and wherein the second EQ is configured to be applied for one or more UIs.

5. The device of claim 1, wherein the output circuit includes:

a first P-channel metal oxide semiconductor (PMOS) configured to supply the high level voltage;

a first N-channel metal oxide semiconductor (NMOS) configured to supply the low level voltage; and a second PMOS and a second NMOS configured to supply the middle level voltage.

6. The device of claim 5, wherein the first PMOS contains a gate to which a first duobinary driving signal is applied and one node to which the high level voltage source is connected such that the high level voltage is supplied to an output node of the output circuit, wherein the first NMOS contains a gate to which a second duobinary driving signal is applied and one node to which the low level voltage source is connected such that the low level voltage is supplied to the output node, wherein the second NMOS contains a gate to which a third duobinary driving signal is applied and one node to which the middle level voltage is applied such that the middle level voltage is supplied to the output node, and wherein the second PMOS contains a gate to which an inversion signal of the third duobinary driving signal is applied and one node to which the middle level voltage is applied such that the middle level voltage is supplied to the output node.

7. The device of claim 6, wherein the first duobinary driving signal includes a signal output through a NAND operation circuit configured to receive an output signal during n UI (n being a natural number) and an output signal during n−1 UI and output a NAND operation result, and a NOT operation circuit configured to receive the output NAND operation result and output a result of 2m NOT operations (m being a natural number).

8. The device of claim 6, wherein the second duobinary driving signal includes a signal output through a NAND operation circuit configured to receive an inversion signal of an output signal during n UI (n being a natural number) and an inversion signal of an output signal during n−1 UI and output a NAND operation result, and a NOT operation circuit configured to receive the output NAND operation result and output a result of 2m−1 NOT operations (m being a natural number).

9. The device of claim 6, wherein the third duobinary driving signal includes a signal output through a third NOR operation circuit configured to receive a first NOR operation result obtained by inputting an output signal during n UI (n being a natural number) and an output signal during n−1 UI to a first NOR operation circuit and a second NOR operation result obtained by inputting an inversion signal of an output signal during n UI and an inversion signal of an output signal during n−1 UI to a second NOR operation circuit and output a third NOR operation result, and a NOT operation circuit configured to receive the output third NOR operation result and output a result of 2m NOT operations (m being a natural number).

10. The device of claim 6, wherein the inversion signal of the third duobinary driving signal includes a signal output through a third NAND operation circuit configured to receive a first NAND operation result obtained by inputting an output signal during n UI (n being a natural number) and an output signal during n−1 UI to a first NAND operation circuit and a second NAND operation result obtained by inputting an inversion signal of an output signal during n UI and an inversion signal of an output signal during n−1 UI to a second NAND operation circuit and output a third NAND operation result, and a NOT operation circuit configured to receive the output third NAND operation result and output a result of 2m NOT operations (m being a natural number).

11. The device of claim 5, wherein the second compensation circuit includes a third PMOS configured to supply the high level voltage and a third NMOS configured to supply the low level voltage, wherein the third PMOS contains a gate to which a (2-1)-th EQ driving signal is applied and one node to which the high level voltage source is connected such that the high level voltage is supplied to an output node of the output circuit, and wherein the third NMOS contains a gate to which a (2-2)-th EQ driving signal is applied and one node to which the low level voltage source is connected such that the low level voltage is supplied to the output node.

12. The device of claim 11, wherein the (2-1)-th EQ driving signal includes a signal output through a NAND operation circuit configured to receive a first NOR operation result obtained by inputting an output signal during n−1 UI (n being a natural number of 2 or more) and an output signal during n UI to a first NOR operation circuit and a second NOR operation result obtained by inputting an output signal during n−2 UI and an inversion signal of an operation signal for the second EQ (the second EQ being activated when the operation signal is 1 and being deactivated when the operation signal is 0) to a second NOR operation circuit and output a NAND operation result, and a NOT operation circuit configured to receive the output NAND operation result and output a result of 2m NOT operations (m being a natural number), and wherein the (2-2)-th EQ driving signal includes a signal output through a NOR operation circuit configured to receive a first NAND operation result obtained by inputting an output signal during n−1 UI (n being a natural number of 2 or more) and an output signal during n UI to a first NAND operation circuit and a second NAND operation result obtained by inputting an output signal during n−2 UI and the inversion signal of the operation signal for the second EQ (the second EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

13. The device of claim 1, wherein the (1-1)-th compensation circuit contains a (1-1)-th PMOS configured to supply the high level voltage and a (1-1)-th NMOS configured to supply the low level voltage, wherein the (1-1)-th PMOS contains a gate to which a (1-1)-th EQ driving signal is applied and one node to which the high level voltage source is connected such that the high level voltage is supplied to an output node of the output circuit, and wherein the (1-1)-th NMOS contains a gate to which a (1-2)-th EQ driving signal is applied and one node to which the low level voltage source is connected such that the low level voltage is supplied to the output node.

14. The device of claim 13, wherein the (1-1)-th EQ driving signal includes a signal output through a NAND operation circuit configured to receive a first NOR operation result obtained by inputting an output signal during n−2 UI (n being a natural number of 2 or more) and an inversion signal of an output signal during n−1 UI to a first NOR operation circuit and a second NOR operation result obtained by inputting an inversion signal of an output signal during n UI and an inversion signal of an operation signal for the (1-1)-th EQ (the (1-1)-th EQ being activated when the operation signal is 1 and being deactivated when the operation signal is 0) to a second NAND operation circuit and output a NAND operation result, and a NOT operation circuit configured to receive the output NAND operation result and output a result of 2m NOT operations (m being a natural number).

15. The device of claim 13, wherein the (1-2)-th EQ driving signal includes a signal output through a NOR operation circuit configured to receive a first NAND operation result obtained by inputting an output signal during n−2 UI (n being a natural number of 2 or more) and an inversion signal of an output signal during n−1 UI to a first NAND operation circuit and a second NAND operation result obtained by inputting an inversion signal of an output signal during n UI and an operation signal for the (1-1)-th EQ (the (1-1)-th EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

16. The device of claim 1, wherein the (1-3)-th compensation circuit includes a (1-3)-th PMOS configured to supply the high level voltage and a (1-3)-th NMOS configured to supply the low level voltage, wherein the (1-3)-th PMOS contains a gate to which a (1-3)-th EQ driving signal is applied and one node to which the high level voltage source is connected such that the high level voltage is supplied to an output node of the output circuit, and wherein the (1-3)-th NMOS contains a gate to which a (1-4)-th EQ driving signal is applied and one node to which the low level voltage source is connected such that the low level voltage is supplied to the output node.

17. The device of claim 16, wherein the (1-3)-th EQ driving signal includes a signal output through a NAND operation circuit configured to receive a first NOR operation result obtained by inputting an output signal during n−2 UI (n being a natural number of 2 or more) and an output signal during n−1 UI to a first NOR operation circuit and a second NOR operation result obtained by inputting an inversion signal of an output signal during n UI and an inversion signal of an operation signal for the (1-3)-th EQ (the (1-3)-th EQ being activated when the operation signal is 1 and being deactivated when the operation signal is 0) to a second NOR operation circuit and output a NAND operation result, and a NOT operation circuit configured to receive the output NAND operation result and output a result of 2m NOT operations (m being a natural number).

18. The device of claim 16, wherein the (1-4)-th EQ driving signal includes a signal output through a NOR operation circuit configured to receive a first NAND operation result obtained by inputting an output signal during n−2 UI (n being a natural number of 2 or more) and an output signal during n−1 UI to a first NAND operation circuit and a second NAND operation result obtained by inputting an inversion signal of an output signal during n UI and an operation signal for the (1-3)-th EQ (the (1-3)-th EQ being activated when the operation signal is 1 and being deactivated when the operation signal is 0) to a second NAND operation circuit and output a NOR operation result, and a NOT operation circuit configured to receive the output NOR operation result and output a result of 2m NOT operations (m being a natural number).

* * * * *